United States Patent [19]

Givens

[11] Patent Number: 5,726,100
[45] Date of Patent: Mar. 10, 1998

[54] METHOD OF FORMING CONTACT VIAS AND INTERCONNECT CHANNELS IN A DIELECTRIC LAYER STACK WITH A SINGLE MASK

[75] Inventor: John H. Givens, Boise, Id.

[73] Assignee: Micron Technology, Inc., Boise, Id.

[21] Appl. No.: 673,773

[22] Filed: Jun. 27, 1996

[51] Int. Cl.$^6$ .................................................. H01L 21/02
[52] U.S. Cl. ...................... 438/702; 438/637; 438/700; 438/740; 438/978
[58] Field of Search .................................. 437/195, 978; 156/659.11, 644.1

[56] References Cited

U.S. PATENT DOCUMENTS

| | | | |
|---|---|---|---|
| 4,808,261 | 2/1989 | Ghidini et al. | 156/653 |
| 5,224,837 | 7/1993 | Dennison | 437/195 |
| 5,266,509 | 11/1993 | Chen | 437/43 |
| 5,397,748 | 3/1995 | Watanabe et al. | 437/239 |
| 5,464,790 | 11/1995 | Hawley | 437/60 |
| 5,529,953 | 6/1996 | Shodia | 437/189 |
| 5,578,523 | 11/1996 | Fiordalie et al. | 437/190 |
| 5,602,053 | 2/1997 | Zheng et al. | 437/60 |

FOREIGN PATENT DOCUMENTS

| | | | |
|---|---|---|---|
| 96/12297 | 4/1996 | WIPO | 21/768 |

OTHER PUBLICATIONS

Wolf, "Silicon Processing for the VLSI Era vol. 1–Process Technology" 565–567, 1986.

Wang, "Chemical–Mechanical Polishing of Dual Damascene Aluminum Interconnect Structures" pp. 117–118, 120, 122, Oct. 1995.

Ueda, "One Mask Inerconnect/Via Formation Technology by Transferring Horizontal mask Paterrn to Vertical Topography" pp. 38–44, Jun. 1995.

White, "Damascene Stud Local Interconnect in CMOS Technology" pp. 11.5.1–11.5.4, Dec. 1992.

Kaanta, "Dual Damascene: A ULSI Wiring Technology" pp.144–152, Jun. 1991.

Wolf, "Silicon Processing for the VLSI Era vol. 1–Process Technology" p.194, 1986.

Ueda, et al. "One Mask Interconnect/Via Formation Technology by Transferring Horizontal Mask patter to Vertical Topography" (Jun. 27–29, 1995, VMIC Conf., 1995 ISMIC—104/95/0038–0044.

*Primary Examiner*—R. Bruce Breneman
*Attorney, Agent, or Firm*—Fillmore, Belliston & Israelsen; Angus C. Fox, III

[57] ABSTRACT

A process is disclosed for forming interconnect channels and contact vias using a single mask. The interconnect channels are formed in an upper silicon dioxide dielectric layer, while the contact vias are formed in both the upper dielectric layer and a lower silicon dioxide dielectric layer. A primary silicon nitride etch stop layer is sandwiched between the upper dielectric layer and the lower dielectric layer, and an optional secondary silicon nitride etch stop layer is sandwiched between a subjacent conductive region and the lower dielectric layer. A contact via/interconnect channel photomask is formed on top of the upper dielectric layer. The critical dimension of the contact via openings is about twice the critical dimension of the interconnect channel openings. A reactive-ion etch, that is selective for silicon dioxide over silicon nitride is performed, exposing the primary etch stop layer in the contact via openings, but not along the length of the interconnect channels. The etch chemistry is then modified so that the reactive-ion etch becomes selective for silicon nitride over silicon dioxide, thus removing the primary silicon dioxide etch stop layer in the contact via openings. The initial etch chemistry is resumed, resulting in the contact being etched down to the secondary etch stop layer and the interconnect channel to the primary etch stop layer. These exposed portions of both etch stop layers are removed by reverting to the silicon nitride selective chemistry.

30 Claims, 8 Drawing Sheets

METHOD OF FORMING CONTACT VIAS AND INTERCONNECT CHANNELS IN A DIELECTRIC LAYER STACK WITH A SINGLE MASK

BACKGROUND OF THE INVENTION

1. Field of the Invention

This invention relates to damascene metalization processes used for integrated circuit manufacture. It is also relates to etch-stop layers and to rate-based etching methods.

2. Description of Related Art

As semiconductor device dimensions become increasingly finer, traditional methods of forming metal interconnect lines and contacts are becoming increasingly unsuitable for use in the manufacture of semiconductor devices of the ULSI generation. The traditional method includes the following steps: (1) depositing a dielectric layer; (2) masking the dielectric layer with a contact via mask; (3) etching contact vias in the dielectric layer; (4) depositing a metal layer which fills the contact vias and covers the upper surface of the dielectric layer; (5) masking the deposited metal layer with a interconnect pattern mask; and (6) etching the metal layer to form an interconnect patter on the upper surface of the dielectric layer. Defective metal etches and particle contamination affecting metalization processes are responsible for a significant reduction in wafer yields. Generally, particle contamination is responsible for open circuits in the metal interconnect system, while a defective etch of a metal layer may result in both shorted or open circuits. Another problem associated with the creation of metal interconnect lines is that metal layers are relatively difficult to etch as compared, for example, to silicon dioxide. As device dimensions become smaller, electromigration becomes a more significant problem. Since electromigration in semiconductor devices is generally associated with the use of nearly pure aluminum for interconnect lines, the problem is most easily eliminated by alloying other metals, such as copper, with aluminum. However, alloys of aluminum that do not exhibit at least minimal grain-boundary diffusion in the presence of an electric current are particularly difficult to etch using plasma or reactive-ion etching techniques.

The etching problems related to copper-aluminum alloys may be avoided by etching grooves in a dielectric layer, filling the grooves with metal, and then employing chemical mechanical polishing, rather than etching, to remove any excess metal.

At the 1995VMIC Conference, Tetsuya Ueda, Takashi Uehara and Mikio Nishio of the Semiconductor Research Center of Matsushita Electric Industrial Co., Ltd. submitted a paper entitled "One Mask Interconnect/Via Formation Technology by Transferring Horizontal Mask pattern to Vertical Topography", in which a process is disclosed for forming both interconnect grooves and contact vias simultaneously using a single mask (Jun. 27–29, 1995 VMIC Conference, 1995 ISMIC—104/95/0038). The process takes advantage of the fact that during a reactive-ion etch, etch rate is critical dimension dependent. Critical dimension is defined as the smallest measurement across a mask aperture. The critical dimension etch rate dependency phenomenon may be stated as follows: Material exposed by a mask aperture having a large critical dimension etches at a faster rate than material exposed by an aperture having a smaller critical dimension. For example, a contact via opening having a critical dimension of 0.5 μm will etch 10–15 percent slower than a 0.8–1.0 contact via opening in a typical $CHF_3/CF_4/Ar$ chemistry. Because minor variations in etch conditions across the wafer can cause etch rate variation, a certain amount of over etch is required to provide the assurance that all contact vias have been fully formed so as to provide adequate electrical contact with an underlying junction. Although over-etching may fully expose a junction within an underlying substrate, it may also cause leakage-promoting damage to the substrate crystal. In addition, without any means of assuring uniform depth of interconnect channels, there will be a certain amount of non-uniformity in interconnect channel depth. This invention represents an improvement over the interconnect/via formation process disclosed by Tetsuya Veda, et al.

SUMMARY OF THE INVENTION

A process is disclosed for forming interconnect channels and contact vias using reactive-ion etching, a single mask, and at least one etch stop layer which provides precise etch control. Interconnect channels are formed in an upper dielectric layer, while the contact vias are formed in both the upper dielectric layer and a lower dielectric layer. A primary dielectric etch stop layer is sandwiched between the upper dielectric layer and the lower dielectric layer. An optional secondary dielectric etch stop layer, which protects an underlying conductive layer (which may be a transistor/source drain region or a lower interconnect layer) from over-etching, is sandwiched between the conductive layer and the lower dielectric layer.

An exemplary, preferred process for forming interconnect channels and contact vias using a single mask, in combination with at least one etch stop layer, employs the following steps in accordance with the present invention. First, the optional secondary dielectric etch stop layer, which may be, but is not limited to, silicon nitride, may be deposited over the conductive layer to which contact is to be made. Second, the lower dielectric layer, which may be, but is not limited to, silicon dioxide, is deposited on top of the secondary dielectric etch stop layer. Third, lower dielectric material is planarized. One method is chemical mechanical polishing. Fourth, the primary dielectric etch stop layer is deposited on top of the lower dielectric layer. Fifth, the upper dielectric layer is deposited on top of the primary dielectric etch stop layer. Sixth, a contact via/interconnect channel photomask is formed on top of the upper dielectric layer. The critical dimension of the contact via openings can be about twice the critical dimension of the interconnect channel openings. In addition, right angled turns for the interconnect channel openings are radiused so that the critical dimension over the course of the turn is approximately equal to that of straight interconnect channel sections. Seventh, a first reactive-ion etch, that is selective for the upper dielectric layer material over the primary etch stop layer material, is performed. The first etch exposes the primary etch stop layer in the contact via openings, but not along the length of the interconnect channels. Eighth, the primary etch stop layer is etched away in the contact via openings with a second etch that is selective for the primary etch stop layer material. Ninth, a subsequent reactive-ion etch selective for the lower dielectric layer over the primary and secondary etch stop layers is performed. Ideally, this subsequent reactive-ion etch step utilizes the same etch chemistry employed during the first reactive-ion etch step. This subsequent etch step is continued until the interconnect channels expose the primary etch stop layer and the contact via exposes either the secondary etch stop layer or the conductive layer if no secondary etch stop layer is present. Tenth, the secondary etch stop layer is removed in the contact via opening. If the primary and second etch stop layers are of the same material, the primary etch stop layer is removed at the bottom of the interconnect channels. Eleventh, the photomask is removed from the surface of the upper dielectric layer. Twelfth, a metal layer is deposited which fills the interconnect channels and the contact via openings. Thirteenth, excess metal is removed with a polishing step, leaving metal only within the confines of the interconnect channels and the contact vias.

PREFERRED EMBODIMENT OF THE INVENTION

Figure 1:
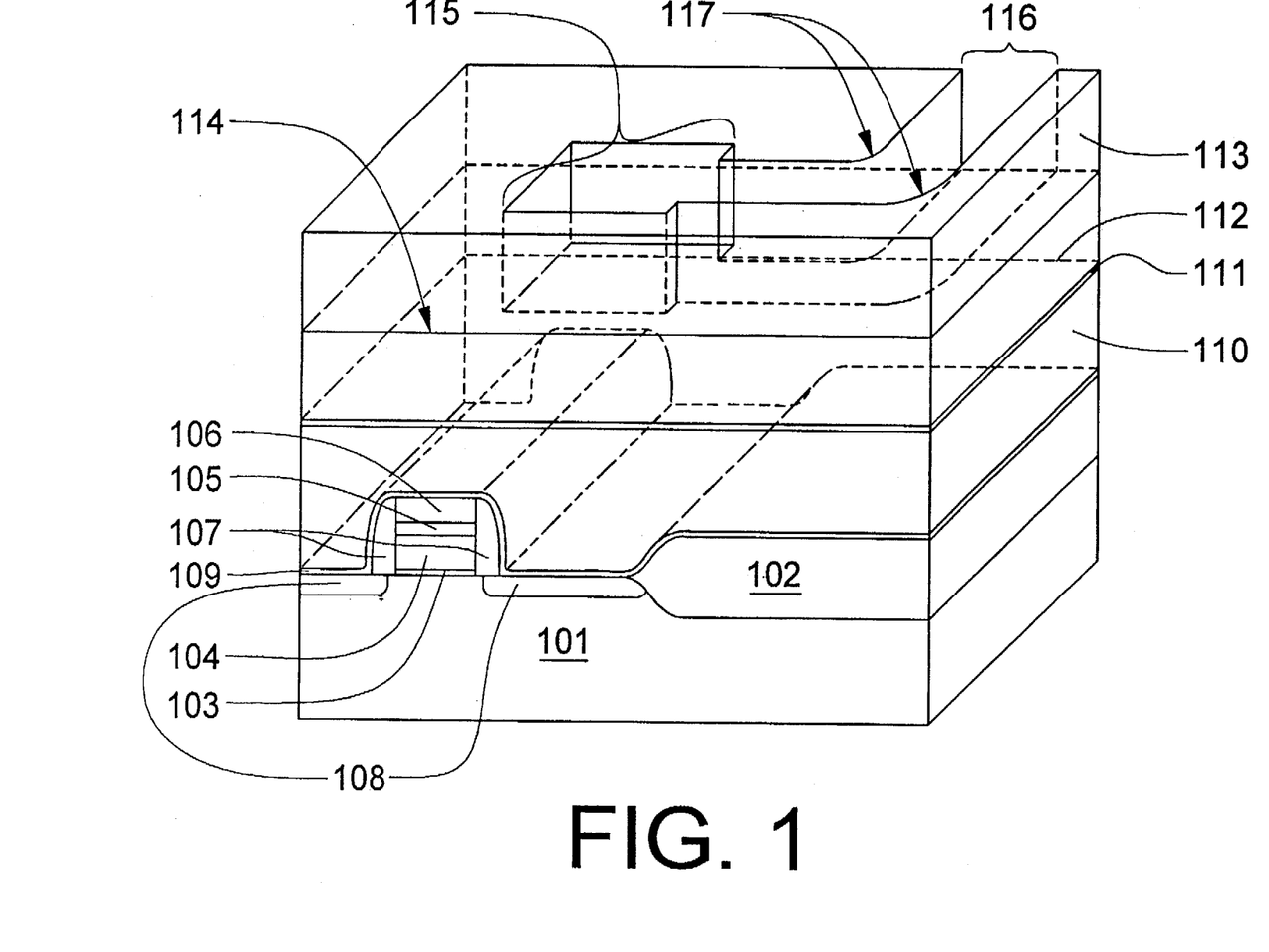
FIG. 1 is an isometric view of a portion of an in-process integrated circuit which has been masked with a contact via/interconnect channel photomask.

Referring now to FIG. 1, a semiconductor substrate 101 has been subjected to various oxidation steps to form a field oxide region 102 and a gate oxide layer 103. A transistor gate stack structure has also been formed which may have a doped polycrystalline silicon layer 104 overlaid with a refractory metal silicide layer 105, which is, in turn, overlaid by a silicon dioxide layer 106. The gate stack structure has vertical sidewalls on which have been formed dielectric sidewall spacers 107. Source/drain regions 108 have been implanted in the substrate on both sides of the gate stack structure. A secondary dielectric etch stop layer 109, which may be silicon nitride via chemical vapor deposition, has been deposited over the source/drain regions 108, the gate stack structure and the field oxide regions 102. A lower dielectric layer 110, which may be boro-phospho-silicate glass (BPSG) or silicon dioxide deposited via chemical vapor deposition with tetra-ethyl-ortho-silicate (TEOS) as the precursor compound, has been deposited on top of the secondary etch stop layer 109. A primary dielectric etch stop layer 111 has been deposited on top of the lower dielectric layer 110. An upper dielectric layer 112, which may be BPSG, TEOS oxide, some other oxide or other dielectric material that demonstrates critical dimension dependent etching in a reactive-ion etch environment, is then deposited on top of the primary etch stop layer 111. Finally, a contact via/interconnect channel photomask 113 has been formed on the upper surface 114 of the upper dielectric layer 112. It will be noted that the critical dimension of the contact via opening 115 is about twice the critical dimension of the interconnect channel opening 116.

Still referring to FIG. 1, it will be noted that the mask aperture for the interconnect channel opening in the region of a right angled turn 117 is radiused so that the critical dimension at the turn is approximately equal that for straight interconnect channel sections. Any time an abrupt, angled turn is negotiated by an interconnect channel opening, whether right angle or not, it should be radiused in order to maintain a relatively constant etch rate over the length of the channel. In other words, intersecting linear segments of an interconnect channel opening must be joined by a curved segment having a critical dimension equal to that of the linear segments.

The secondary dielectric etch stop layer 109 should have the following qualities: it can be etched selectively (preferably via a reactive-ion etch) with respect to the underlying conductive layer, which may be transistor source/drain regions (as depicted in this example), an underlying interconnect pattern formed of doped silicon, a metal silicide, or metal; and the lower dielectric layer 110 can be etched selectively (also preferably via a reactive-ion etch) with respect to the secondary dielectric etch stop layer 109.

The primary dielectric etch stop layer 111, on the other hand, should have the following qualities: both the upper dielectric layer 112 and the lower dielectric layer 110 can be etched selectively with respect thereto (i.e., layer 111).

Figure 2:
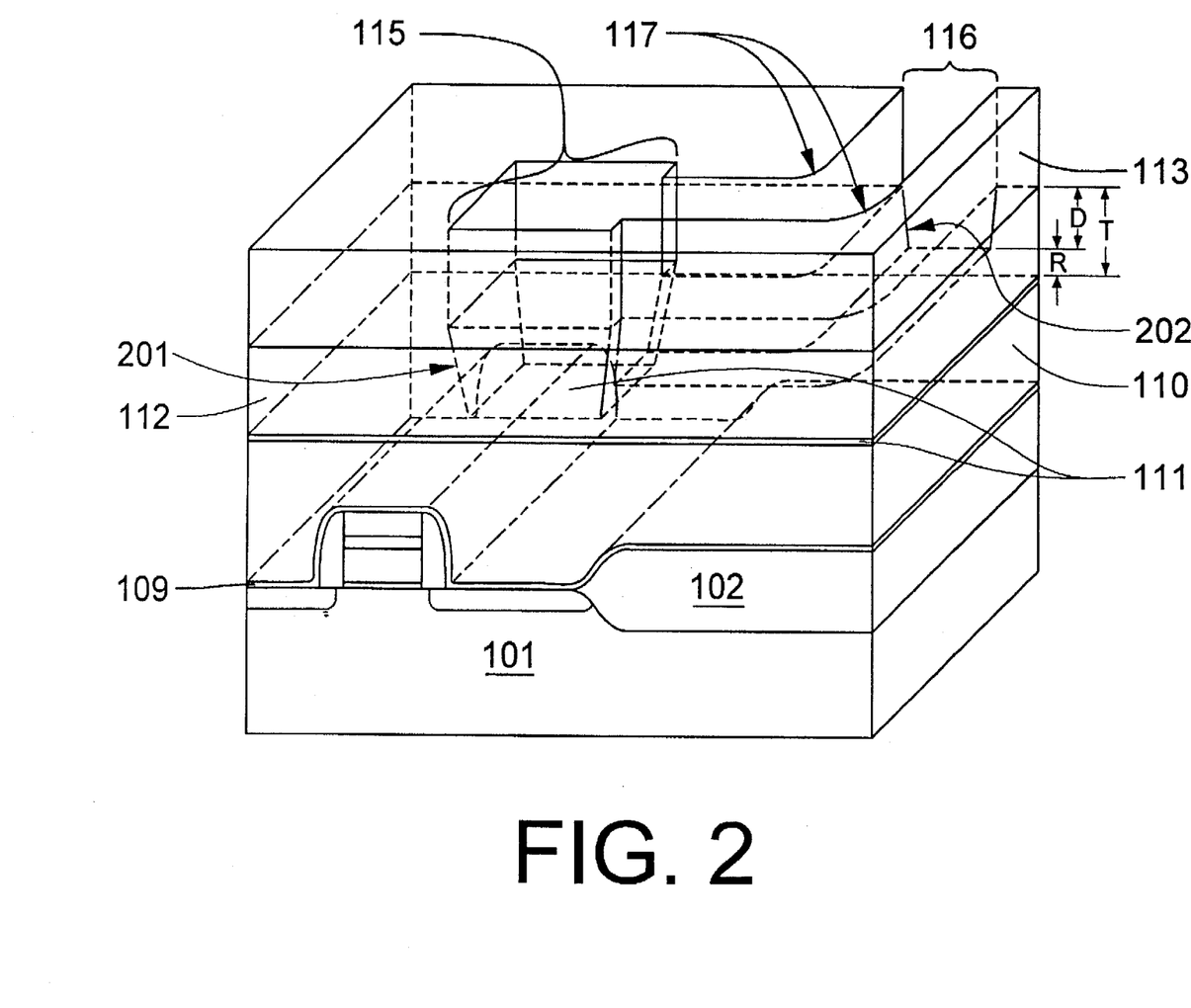
FIG. 2 is an isometric view of the portion of the in-process integrated circuit depicted in FIG. 1 following a first reactive-ion etch step.

Referring now to FIG. 2, the in-process integrated circuit depicted in FIG. 1 has been subjected to a first reactive-ion etch step. The process takes advantage of the fact that during a reactive-ion etch of silicon dioxide, etch rate is critical dimension dependent (critical dimension being defined as the smallest measurement across a mask aperture). The critical dimension etch rate dependency phenomenon may be stated as follows: Silicon dioxide exposed by a mask aperture having a large critical dimension etches at a faster rate that material exposed by an aperture having a smaller critical dimension. Given the existence of this phenomenon, the insulative material exposed by the mask in the contact via opening 115 will etch at a faster rate and expose the primary etch stop layer 111 sooner than the insulative material exposed by the mask in the interconnect channel opening 116. During this portion of the process, the invention employs a reactive-ion etch that is selective for silicon dioxide over silicon nitride and which has been optimized to accentuate the critical dimension dependent etch rate phenomenon. At the end of this etch step, the contact via 201 extends to the primary etch stop layer 111. This condition may be determined using emitted energy and endpoint detection. The interconnect channel 202 is formed to only about 85 percent of its final depth. Thus, the primary etch stop layer 111 is not exposed at the bottom thereof. In FIG. 2, T equals the total thickness of the upper dielectric layer 112, D equals the depth of the partially formed interconnect channel 201, and R equals the remaining distance to which the partially formed interconnect channel 201 will be etched.

Figure 3:
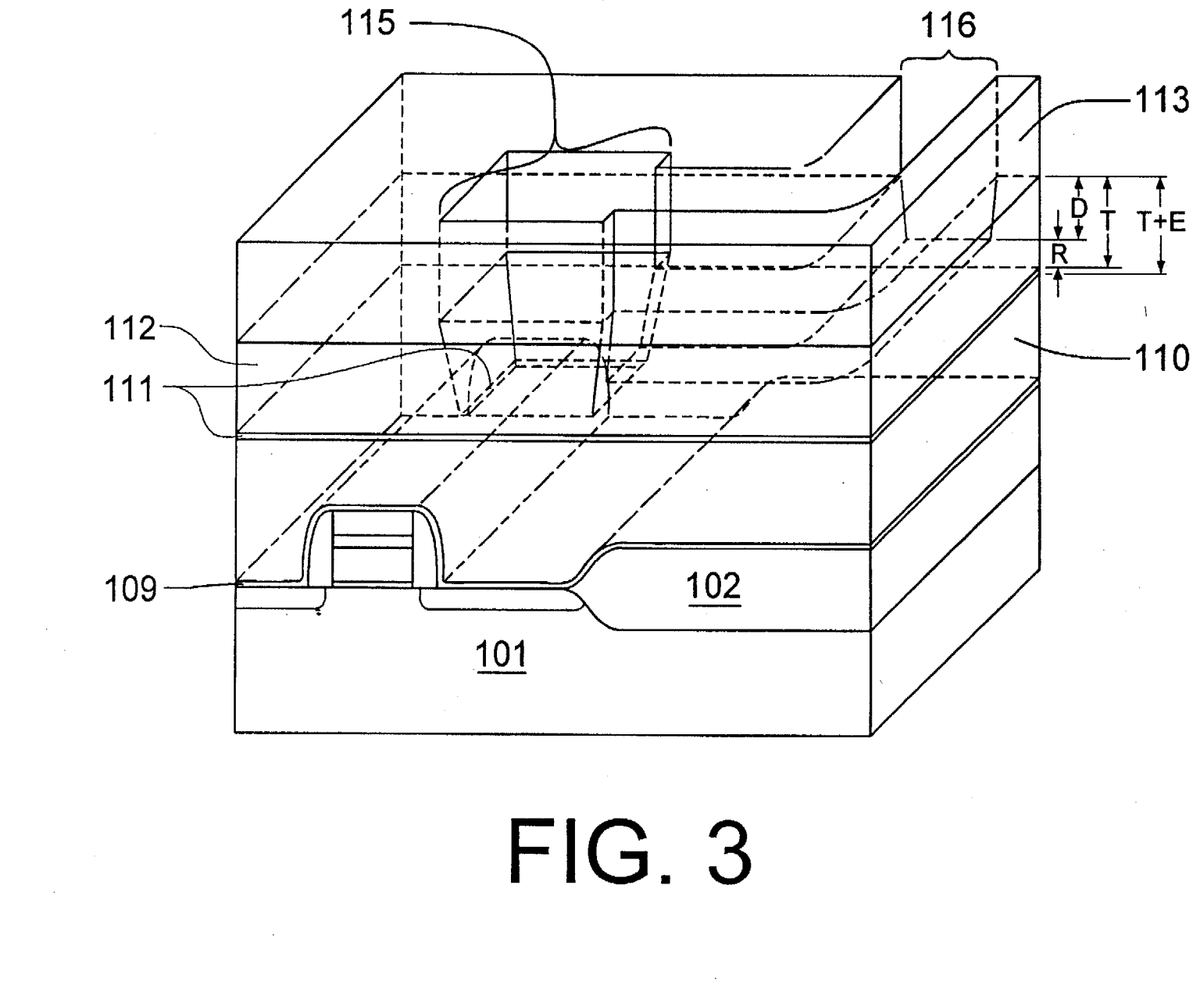
FIG. 3 is an isometric view of the portion of the in-process integrated circuit depicted in FIG. 2 following removal of the primary etch stop layer in the region of the contact via opening.

Referring now to FIG. 3, the portion of the primary etch stop layer 111 that is exposed at the bottom of the contact via 201 is removed. In a preferred embodiment of the process, the primary etch stop layer 111 is silicon nitride. Thus, once the optical endpoint is detected, the etch chemistry is modified so that the reactive-ion etch becomes selective for silicon nitride over silicon dioxide. Although less convenient, the portion of the silicon nitride primary etch stop layer 111 at the bottom of the incomplete contact via may also be removed with a wet etch selective for silicon nitride over silicon dioxide. In FIG. 3, T+E (total thickness of the upper dielectric layer plus the thickness of the primary etch stop layer) represents the depth of the contact via at this stage of the process.

Figure 4:
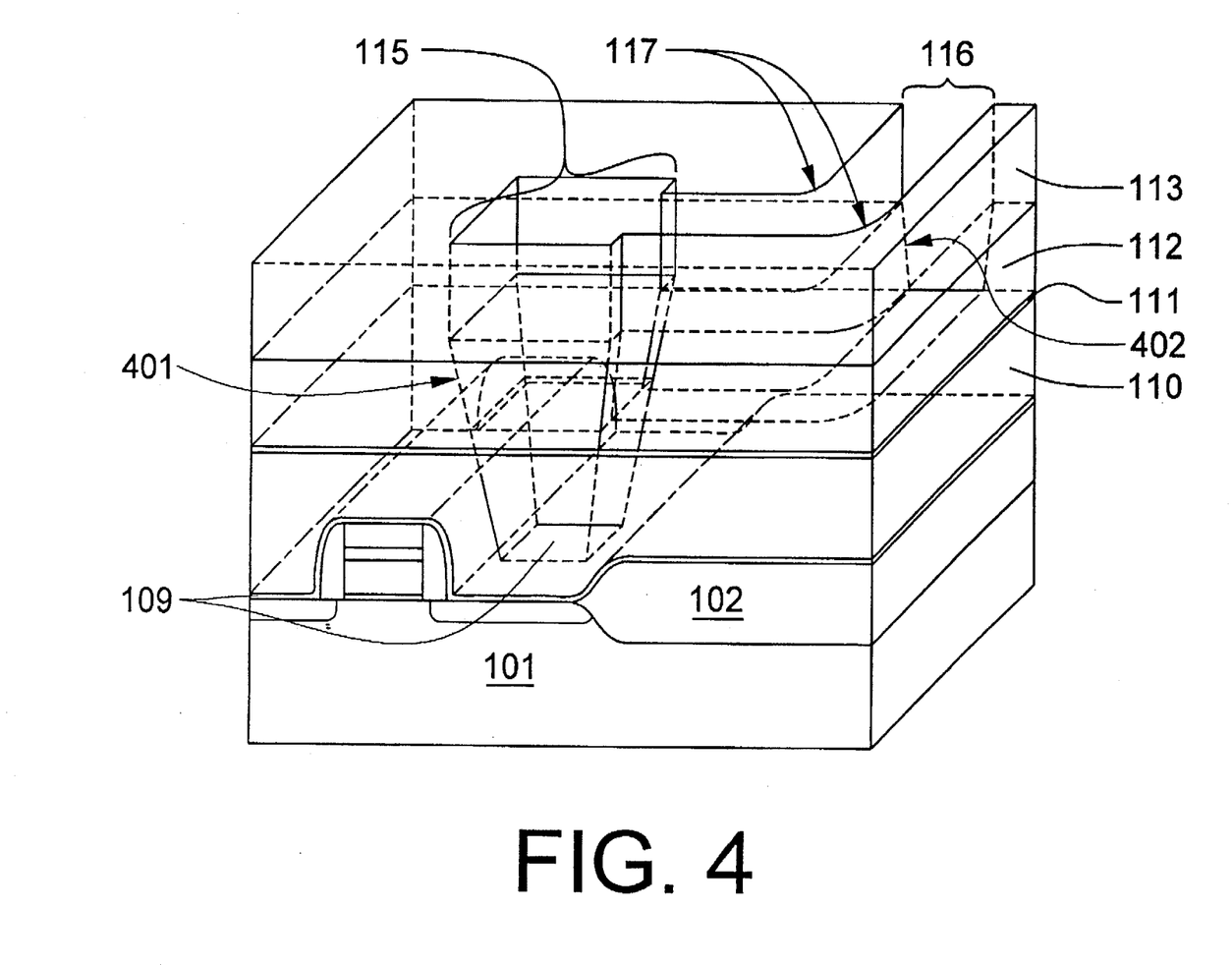
FIG. 4 is an isometric view of the portion of the in-process integrated circuit depicted in FIG. 3 following a second reactive-ion etch step.

Referring now to FIG. 4, once the silicon nitride layer at the bottom of the incomplete contact via region 115 has been removed, the reactive-ion etch chemistry is adjusted to once again become selective for silicon dioxide over silicon nitride. This subsequent etch step is continued until the interconnect channels 402 (formerly 202 when only about 85 percent completed) extend downwardly to the primary etch stop layer 111. In addition, this etch step also exposes either the secondary etch stop layer 109 or, if no secondary etch stop layer is present, then the source/drain region 108 beneath the contact via aperture in the photomask 113. In all likelihood, the primary etch stop layer is exposed at the bottom of the interconnect channels 401 prior the exposure of the secondary etch stop layer 109 or the source/drain region 108 at the bottom of the nearly fully formed contact via 401 (formerly numbered 201 when it extended downwardly to the primary etch stop layer 111.

Figure 5:
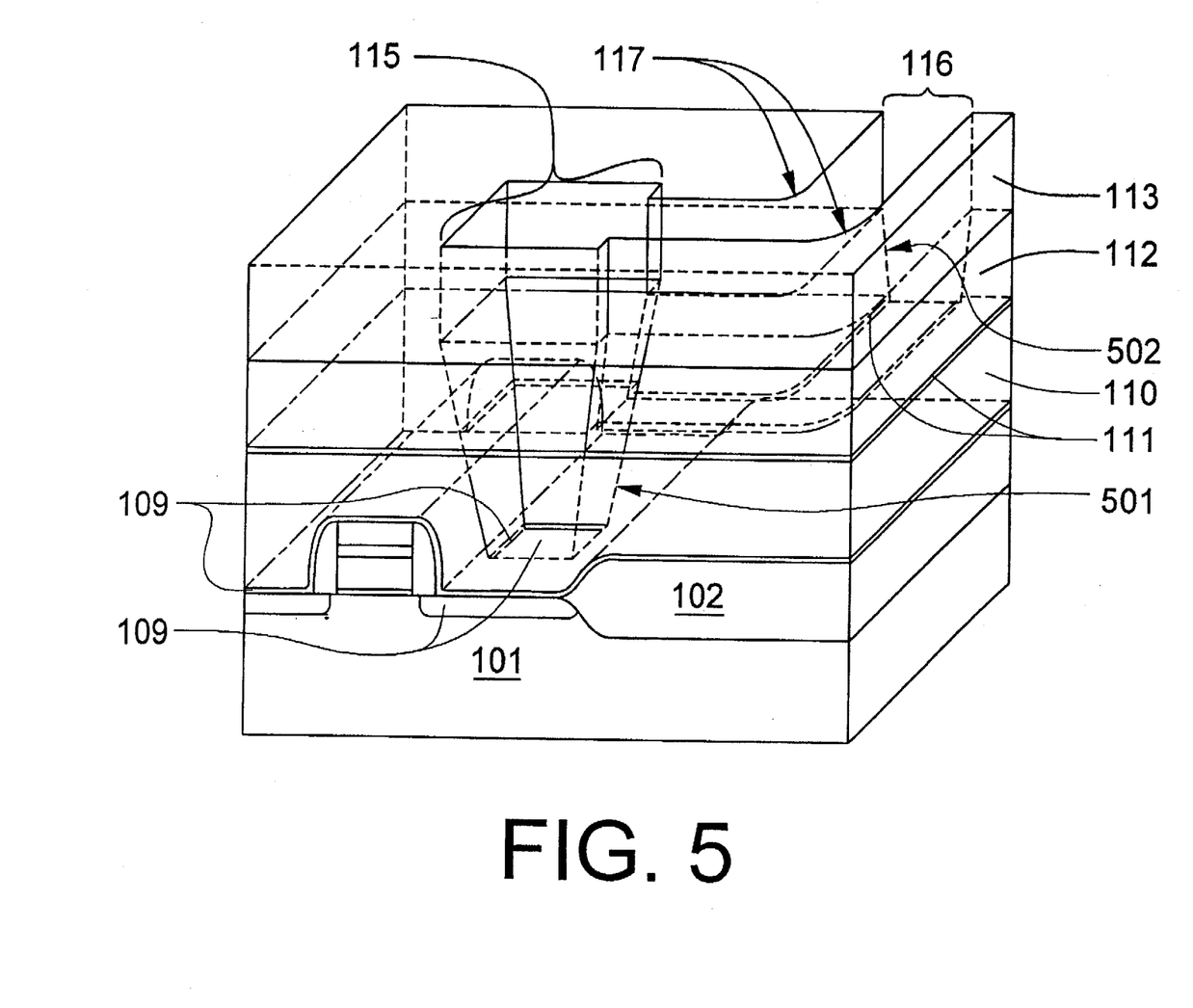
FIG. 5 is an isometric view of the portion of the in-process integrated circuit depicted in FIG. 4 following removal of the secondary etch stop layer at the bottom of the contact via opening and removal of the primary etch stop layer at the bottom of the interconnect channels.

Referring now to FIG. 5, the portion of the secondary etch stop layer 109 at the bottom of the contact via 401 is removed, thus completing the contact via. The fully formed contact via 501 extends to source/drain region 108. Additionally, the portion of the primary etch stop layer 111 at the bottom of the interconnect channel 402 is also removed. The fully formed interconnect channel 502 extend downwardly to the lower dielectric layer 110. In a preferred embodiment of the process, the secondary etch stop layer, like the primary etch stop layer, is silicon nitride. Thus, removal of the aforesaid etch stop layer portions is most easily accomplished by again modifying the etch chemistry so that the reactive-ion etch becomes selective for silicon nitride over silicon dioxide. Although less convenient, the etch stop layer portions may also be removed with a wet etch selective for silicon nitride over silicon dioxide. Additionally, the etch stop layer portions may also be removed following removal of the mask 113.

Figure 6:
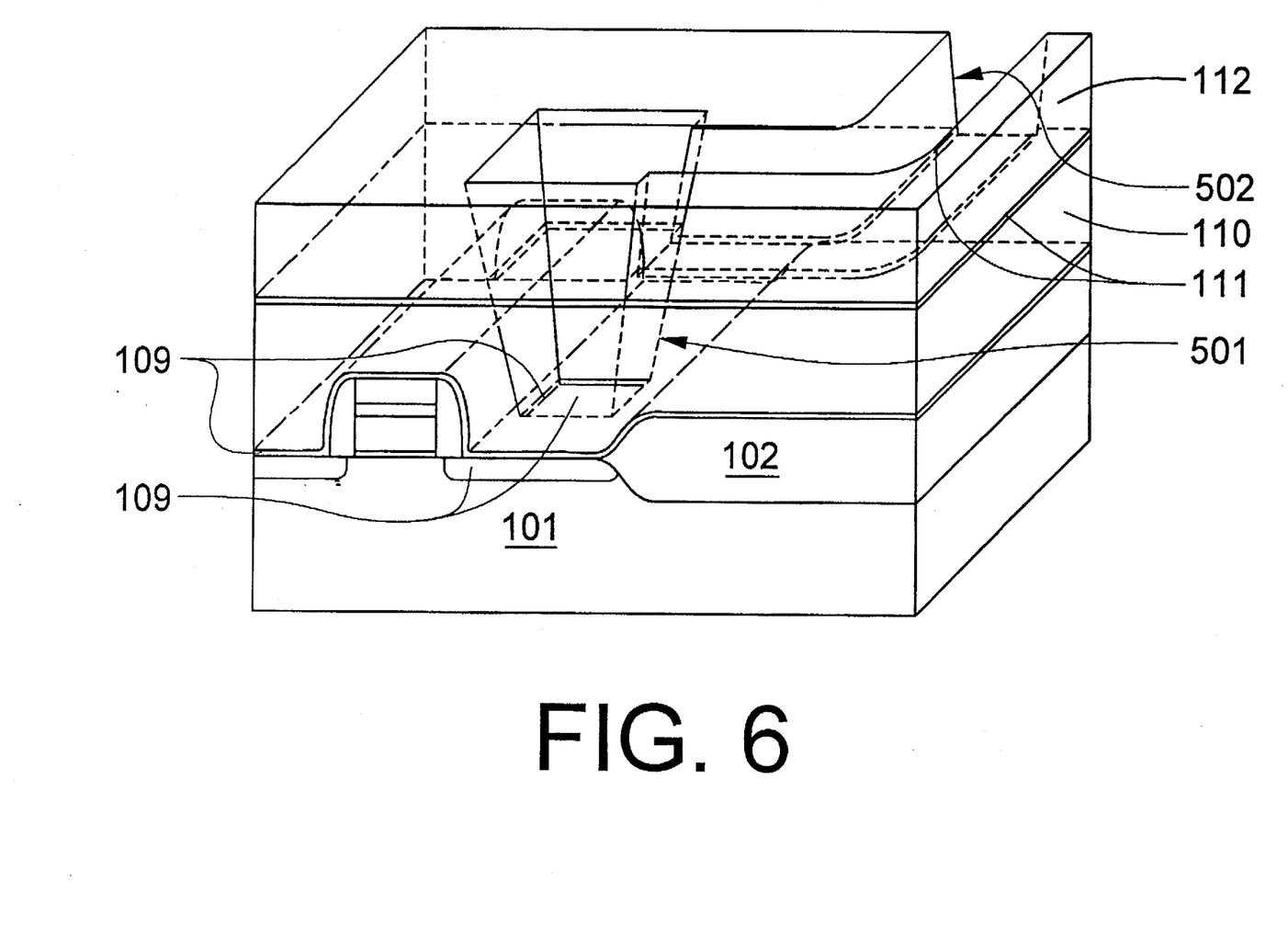
FIG. 6 is an isometric view of the portion of the in-process integrated circuit depicted in FIG. 5 following removal of the photomask.

Referring now to FIG. 6, the photomask has been stripped from the in-process integrated circuit depicted in FIG. 5.

Figure 7:
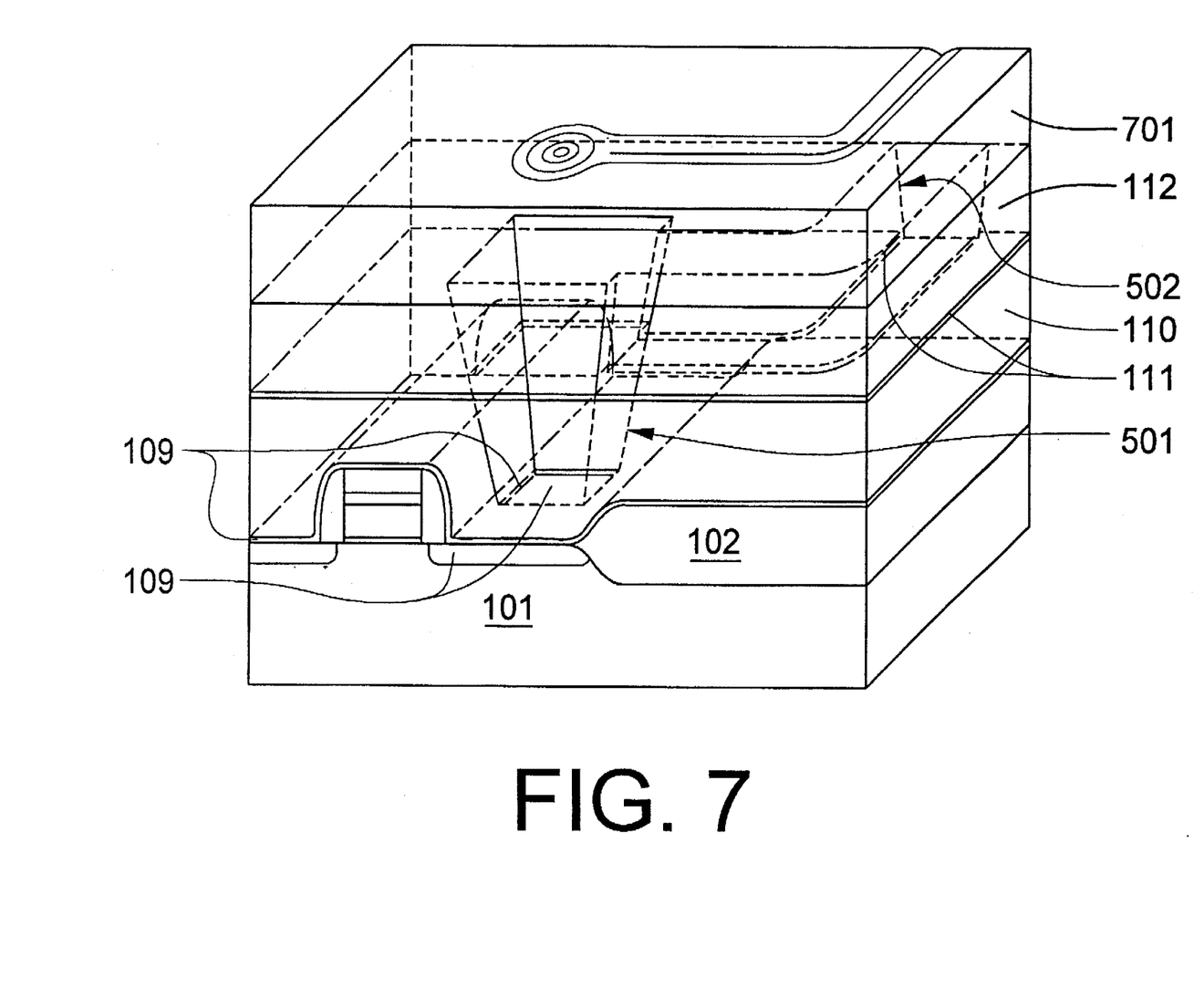
FIG. 7 is an isometric view of the portion of the in-process integrated circuit depicted in FIG. 6 following deposition of a metal layer which fills the contact via openings and the interconnect channels.

Referring now to FIG. 7, a metal layer stack 701 has been processed. In an embodiment of the invention for use with the current generation of integrated circuits, this metal layer 701 is an aluminum-copper-silicon alloy with known underlayers stack. The metal layer 701 completely fills both the contact via 501 and the interconnect channel 502. It will be noted that the metal layer stack 701 has been processed in a relatively conformal manner. Thus metal layer 701 covers the upper surface of the upper dielectric layer 112.

Figure 8:
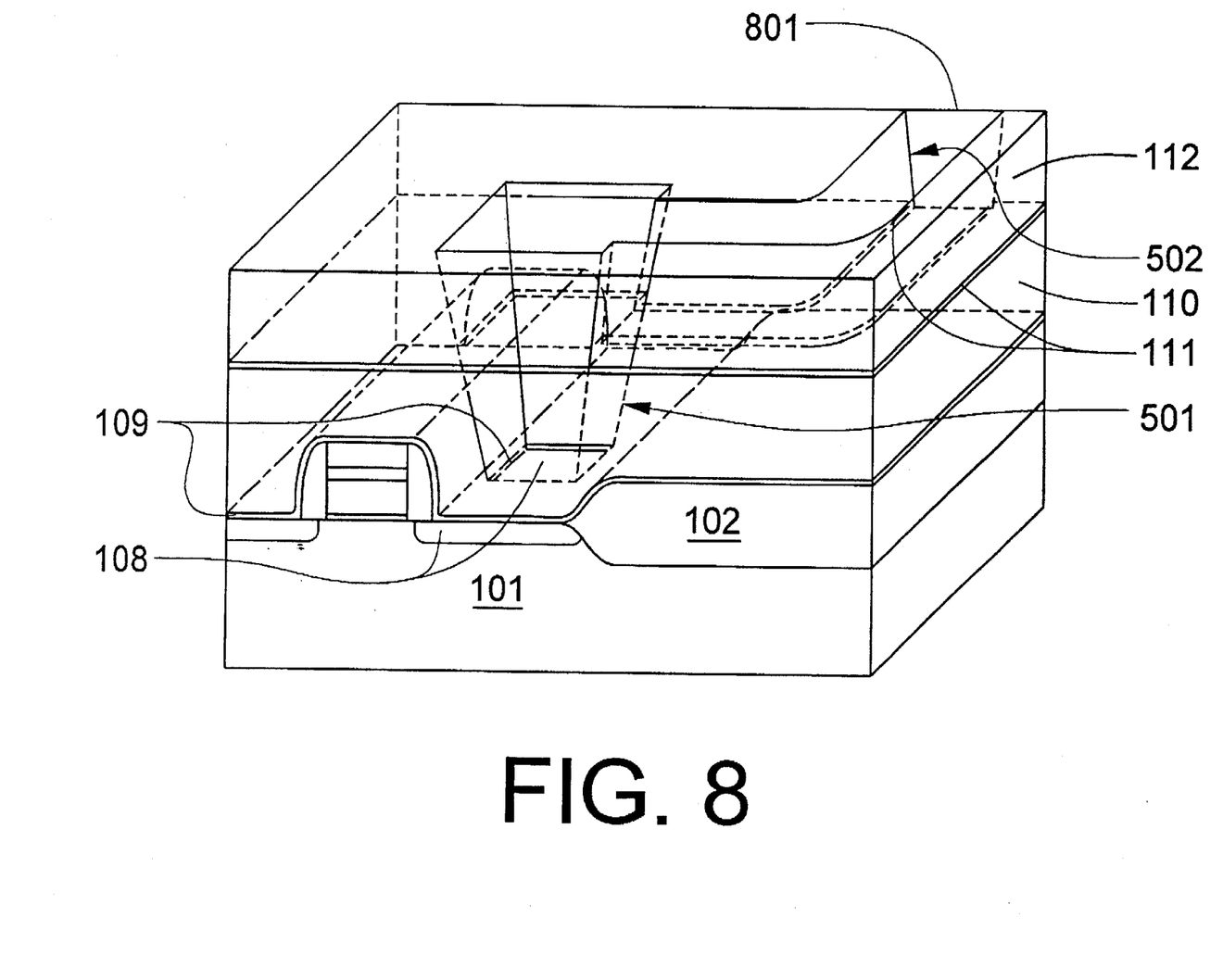
FIG. 8 is an isometric view of the portion of the in-process integrated circuit depicted in FIG. 7 following a mechanical polishing step which has removed metal from the upper surface of the upper dielectric layer.

Referring now to FIG. 8, either a mechanical polishing or a chemical-mechanical polishing step has been employed to remove metal from the upper surface of the upper dielectric layer 112. The mechanical polishing step totally relies on mechanical abrasion to remove the excess metal from the upper surface of the upper dielectric layer 112, while the chemical mechanical polishing step relies on both chemical dissolution and mechanical abrasion to remove the excess metal. In either case, metal is left remaining only in the contact via 501 and in the interconnect channel 502.

Although only several embodiments of the process for forming contact vias and interconnect channels in a dielectric stack with a single mask are disclosed herein, it will be obvious to those having ordinary skill in the art of integrated circuit manufacture, that changes and modifications may be made thereto without departing from the scope and the spirit of the invention as hereinafter claimed.

I claim:

1. A process for forming contact vias and interconnect channels in a dielectric layer stack having a lower dielectric layer, an upper dielectric layer, and a primary dielectric etch stop layer sandwiched between the upper and lower dielectric layers, said process comprising the steps of:

(a) forming a photomask on an upper surface of the upper dielectric layer, said photomask having a first set of apertures defining a contact via pattern, each aperture of the first set having a corresponding first critical dimension, said photomask also having a second set of apertures defining an interconnect channel pattern having both linear segments and at least one curved segment which interconnects a pair of linear segments, each linear segment and each curved segment of each aperture of the second set having a corresponding second critical dimension that is less than said first critical dimension;

(b) performing a first etch that is selective for the first dielectric layer over the primary etch stop layer, said first etch continuing until selected first portions of the primary etch stop layer are exposed below each aperture of said first set, but before selected second portions of the primary etch stop layer are exposed below any aperture of said second set;

(c) removing said first portions of the primary etch stop layer; and (d) performing a second etch that is selective for both the upper dielectric layer and the lower dielectric layer over the primary etch stop layer, said second etch proceeding until said second portions of the primary etch stop layer are exposed and until the lower dielectric layer is perforated below each aperture of said first set.

2. The process of claim 1, wherein both said first and second etches are reactive-ion etches.

3. The process of claim 2, wherein exposure of the selected first portions of the primary etch stop layer is detected by monitoring an emitted energy level during the first reactive-ion etch.

4. The process of claim 1, wherein said dielectric layer stack also has a secondary dielectric etch stop layer subjacent and in contact with the lower dielectric layer, said secondary etch stop layer overlying conductive regions, to each of which electrical contact must be made through a contact via.

5. The process of claim 4, wherein a selected portion of the secondary etch stop layer is exposed at the bottom of each contact via as the lower dielectric layer is perforated, and the process further comprises the step of removing said selected portion of the secondary etch stop layer at the bottom of each contact via and said second portions of the primary etch stop layer following the second etch.

6. The process of claim 5, wherein exposure of the selected portions of the secondary etch stop layer is detected by monitoring an emitted energy level during the second reactive-ion etch.

7. The process of claim 4, wherein, compositionally, said primary and secondary etch stop layers are predominantly silicon nitride.

8. The process of claim 4 wherein removal of said selected portion of the secondary etch stop layer at the bottom of each contact via and said second portions of the primary etch stop layer is accomplished with a reactive-ion etch that is selective for the both the primary and the secondary etch stop layers over the upper and lower dielectric layers.

9. The process of claim 1 wherein, compositionally, the upper and lower dielectric layers are predominantly silicon dioxide.

10. The process of claim 1, wherein said first portions of the primary etch stop layer are removed with a reactive-ion etch that is selective for the primary etch stop layer over the upper dielectric layer.

11. A process for forming both a vertically-oriented contact via, which extends from an upper level of an integrated circuit to a conductive region at a lower level within the circuit, and an interconnect channel having both linear segments and at least one curved segment joining a pair of linear segments within the upper level of the circuit, said channel being continuous with an upper portion of said via, said process comprising the steps of:

(a) depositing a lower dielectric layer over the conductive regions;

(b) depositing a primary dielectric etch stop layer above the lower dielectric layer;

(c) depositing an upper dielectric layer above the primary etch stop layer;

(d) forming a photomask on an upper surface of the upper dielectric layer, said photomask having a first aperture defining a pattern for said contact via, said first aperture having a first critical dimension, said photomask also having a second aperture defining a pattern for said interconnect channel, said second aperture having both linear segments and at least one curved segment which interconnects a pair of linear segments, each of said linear segments and said curved segment having a second critical dimension that is less than said first critical dimension;

(e) performing a first etch that is selective for the first dielectric layer over the primary etch stop layer, said first etch continuing until selected first portions of the primary etch stop layer are exposed below each aperture of said first set, but before selected second portions of the primary etch stop layer are exposed below apertures of said second set;

(f) removing said first portions of the primary etch stop layer;

(g) performing a second etch that is selective for both the upper dielectric layer and the lower dielectric layer over the primary etch stop layer, said second etch proceeding until said second portions of the primary etch stop layer are exposed and until the lower dielectric layer is perforated below each aperture of said first set; and (h) removing the photomask.

12. The process of claim 11, wherein said first and second etches are reactive-ion etches.

13. The process of claim 12, wherein exposure of the selected first portions of the primary etch stop layer is detected by monitoring an emitted energy level during the first reactive-ion etch.

14. The process of claim 11, which further comprises the steps of:

(a) depositing a secondary dielectric etch stop layer above the conductive region prior to depositing the lower dielectric layer;

(b) exposing a selected portion of the secondary etch stop layer at the bottom of the contact via as the lower dielectric layer is perforated; and (c) removing said selected portion of the secondary etch stop layer and said second portions of the primary etch stop layer after the second etch.

15. The process of claim 14, wherein exposure of the selected portions of the secondary etch stop layer is detected by monitoring an emitted energy level during the second reactive-ion etch.

16. The process of claim 11 wherein, compositionally, the upper and lower dielectric layers are predominantly silicon dioxide, and the primary etch stop layer is predominantly silicon nitride.

17. The process of claim 11, which further comprises the additional process of forming metal structures within said via and said channel, said additional process comprising the steps of:

(a) depositing a metal layer stack which fills the contact via and interconnect channel and covers the upper surface of the upper dielectric layer; and (b) removing a selected portion of the metal layer stack which covers the upper surface of the upper dielectric layer so as to leave metal in only the contact via and in the interconnect channel.

18. A process for forming contact and interconnect structures in a dielectric layer stack having a lower dielectric layer, an upper dielectric layer, and a primary dielectric etch stop layer sandwiched between the upper and lower dielectric layers, said process comprising the steps of:

(a) forming a photomask on an upper surface of the upper dielectric layer, said photomask having a first set of apertures defining a contact via pattern, each aperture of the first set having a corresponding first critical dimension, said photomask also having a second set of apertures defining an interconnect channel pattern having both linear segments and at least one curved segment which interconnects a pair of linear segments, each linear segment and each curved segment of each aperture of the second set having a corresponding second critical dimension that is less than said first critical dimension;

(b) performing a first etch that is selective for the first dielectric layer over the primary etch stop layer, said first etch continuing until selected first portions of the primary etch stop layer are exposed below each aperture of said first set, but before selected second portions of the primary etch stop layer are exposed below any aperture of said second set;

(c) removing said first portions of the primary etch stop layer;

(d) performing a second etch that is selective for both the upper dielectric layer and the lower dielectric layer over the primary etch stop layer, said second etch proceeding until said second portions of the primary etch stop layer are exposed and until the lower dielectric layer is perforated below each aperture of said first set;

(e) removing the photomask;

(f) depositing a metal layer stack which fills the contact vias and interconnect channels and covers the upper surface of the upper dielectric layer; and (g) removing the metal stack which covers the upper surface of the upper dielectric layer so as to leave metal in only the contact vias and in the interconnect channels.

19. The process of claim 18, wherein both first and second etches are reactive-ion etches.

20. The process of claim 19, wherein exposure of the selected first portions of the primary etch stop layer is detected by monitoring an emitted energy level during the first reactive-ion etch.

21. The process of claim 18, wherein said dielectric layer stack also has a secondary dielectric etch stop layer below and in contact with the lower dielectric layer, said secondary etch stop layer overlying conductive regions, to each of which electrical contact must be made through a contact via.

22. The process of claim 21, wherein a selected portion of the secondary etch stop layer is exposed at the bottom of each contact via as the lower dielectric layer is perforated, and the process further comprises the step of removing said selected portion of the secondary etch stop layer at the bottom of each contact via and the other portions of the primary etch stop layer after the second etch step, but before the step of depositing the metal layer.

23. The process of claim 22, wherein exposure of the selected portions of the secondary etch stop layer is detected by monitoring an emitted energy level during the second reactive-ion etch.

24. The process of claim 21, wherein, compositionally, said primary and secondary etch stop layers are predominantly silicon nitride.

25. The process of claim 21 wherein removal of said selected portion of the secondary etch stop layer at the bottom of each contact via and said second portions of the primary etch stop layer is accomplished with a reactive-ion etch that is selective for the primary and secondary etch stop layers over the upper and lower dielectric layers.

26. The process of claim 18 wherein, compositionally, the upper and lower dielectric layers are predominantly silicon dioxide.

27. The process of claim 18, wherein said first portions of the primary etch stop layer are removed with a reactive-ion etch that is selective for the primary etch stop layer over the upper dielectric layer.

28. The process of claim 18 wherein removal of the metal which covers the upper surface of the upper dielectric layer is accomplished with a polishing step.

29. The process of claim 28, wherein the metal is removed via mechanical abrasion.

30. The process of claim 28, wherein the metal is removed via mechanical abrasion in combination with chemical dissolution.

* * * * *